United States Patent
Kamp et al.

(10) Patent No.: US 8,766,731 B2
(45) Date of Patent: Jul. 1, 2014

(54) OSCILLATOR CIRCUIT AND METHOD OF PROVIDING AN OSCILLATOR OUTPUT SIGNAL

(75) Inventors: Petrus Johannes Maria Kamp, Rosmalen (NL); Hermanus Johannes Nijrolder, Oss (NL)

(73) Assignee: Anagear B.V., Rosmalen (NL)

( * ) Notice: Subject to any disclaimer, the term of this patent is extended or adjusted under 35 U.S.C. 154(b) by 137 days.

(21) Appl. No.: 13/509,469

(22) PCT Filed: Nov. 10, 2010

(86) PCT No.: PCT/NL2010/050748
§ 371 (c)(1),
(2), (4) Date: Aug. 27, 2012

(87) PCT Pub. No.: WO2011/059322
PCT Pub. Date: May 19, 2011

(65) Prior Publication Data
US 2013/0088301 A1    Apr. 11, 2013

Related U.S. Application Data

(60) Provisional application No. 61/260,027, filed on Nov. 11, 2009.

(51) Int. Cl.
*H03K 3/02* (2006.01)
*H03K 3/023* (2006.01)
*H03K 4/12* (2006.01)

(52) U.S. Cl.
USPC .............................. 331/49; 331/143; 331/153

(58) Field of Classification Search
USPC .......... 327/131–138; 331/46, 49, 55, 74, 111, 331/143, 150, 153
See application file for complete search history.

(56) References Cited

U.S. PATENT DOCUMENTS

| 4,620,162 | A | * | 10/1986 | Quittkat et al. | 331/45 |
| 5,670,915 | A | * | 9/1997 | Cooper et al. | 331/111 |
| 6,052,035 | A | * | 4/2000 | Nolan et al. | 331/74 |
| 6,326,859 | B1 | * | 12/2001 | Goldman et al. | 331/143 |
| 6,456,127 | B1 | * | 9/2002 | Tsecouras | 327/133 |
| 7,109,804 | B2 | | 9/2006 | Mader et al. | |

(Continued)

FOREIGN PATENT DOCUMENTS

WO    WO 2008/026314    *    3/2008    .......... H03K 3/0231

OTHER PUBLICATIONS

International Search Report for corresponding PCT application No. PCT/NL2010/050748 mailed Feb. 23, 2011.

*Primary Examiner* — Levi Gannon
(74) *Attorney, Agent, or Firm* — Wood, Phillips, Katz, Clark & Mortimer

(57) ABSTRACT

The present invention is directed to an oscillator circuit comprising an oscillator input for providing an input signal, a first integrator circuit comprising a first integrator capacitor and a first integrator output, a comparator, a discharge circuit for discharging said first integrator capacitor once per cycle of said oscillator circuit, and an oscillator output for providing an output signal, wherein said oscillator circuit further comprises a second integrator circuit comprising a second integrator capacitor and a second integrator output, and wherein said oscillator circuit is arranged for allowing said input signal to be subsequently integrated by said first and second integrator circuit in an alternating manner, and for providing said integrated output signal of said first and second integrator circuit subsequently to said comparator in said alternating manner.

11 Claims, 5 Drawing Sheets

(56) References Cited

U.S. PATENT DOCUMENTS

| | | | |
|---|---|---|---|
| 7,135,937 B2 * | 11/2006 | Mitsuda | 331/143 |
| 7,307,481 B1 * | 12/2007 | Bell et al. | 331/49 |
| 7,348,812 B2 * | 3/2008 | Ikezawa | 327/131 |
| 7,375,599 B2 * | 5/2008 | Molina | 331/143 |
| 7,474,163 B1 * | 1/2009 | Wile et al. | 331/143 |
| 7,847,648 B2 * | 12/2010 | Hu et al. | 331/143 |
| 8,508,306 B2 * | 8/2013 | Choe et al. | 331/143 |
| 2005/0237118 A1 | 10/2005 | Mader et al. | |
| 2007/0182499 A1 | 8/2007 | Wakai et al. | |
| 2008/0180151 A1 | 7/2008 | Gong et al. | |

\* cited by examiner

Frequency at Vout: Fout = 1/Tper = Iref/(Vref1*Csw)

Fig. 2A
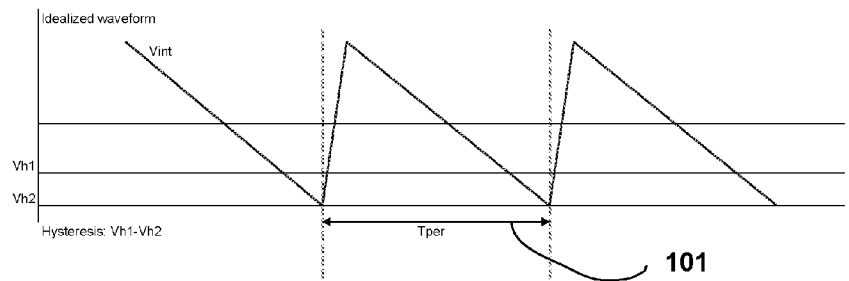
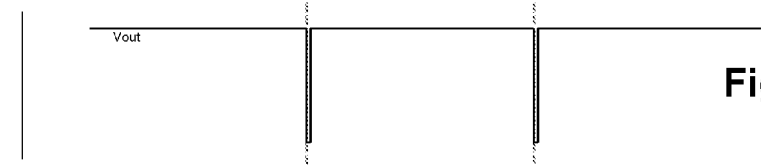
Fig. 2B
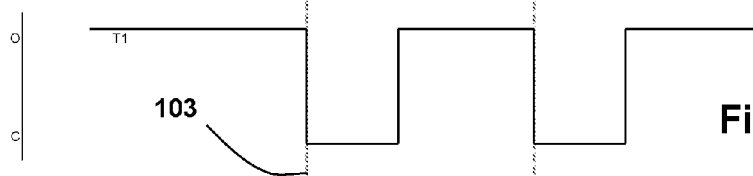
Fig. 2C
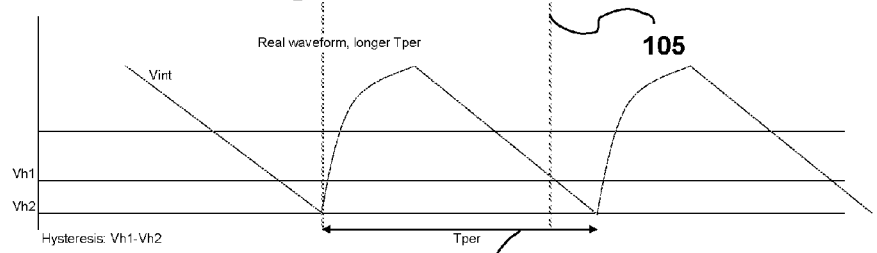
Fig. 2D

Frequency at Vout: Fout = Iref/(2*Vref*Csw)

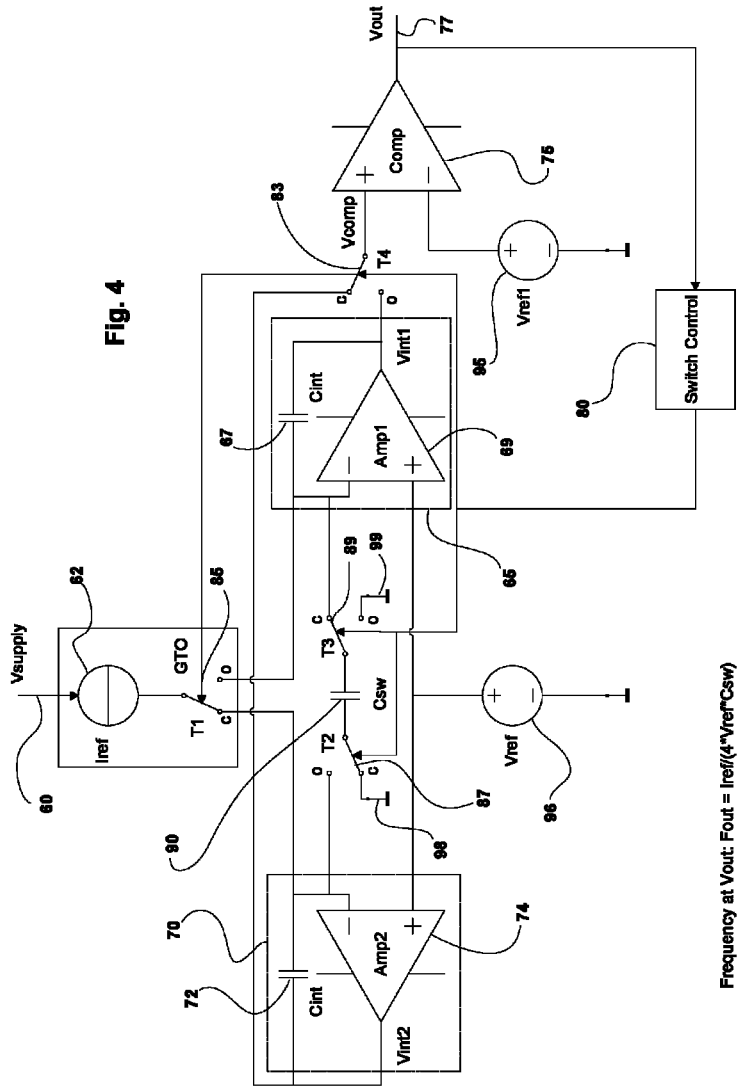

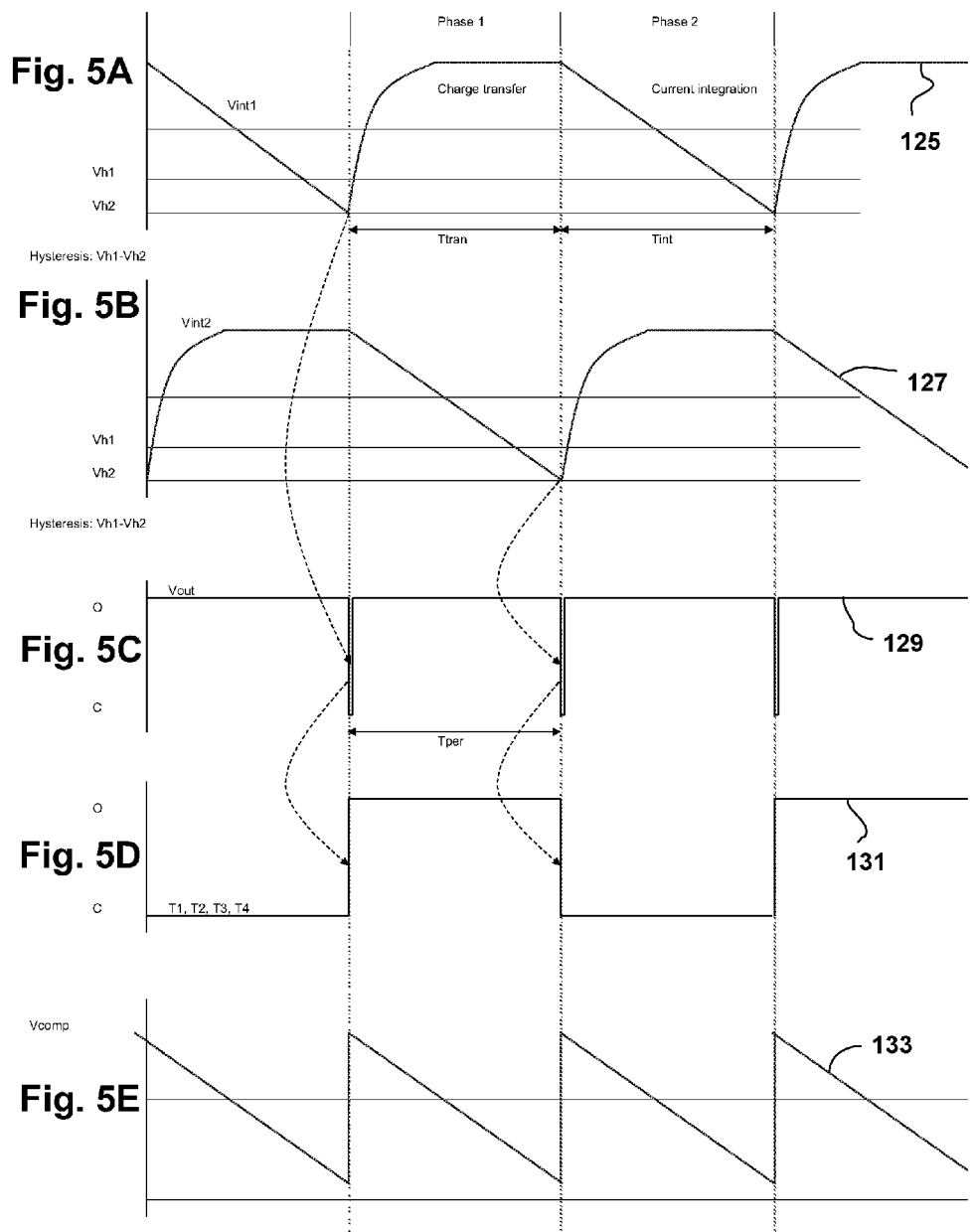

US 8,766,731 B2

OSCILLATOR CIRCUIT AND METHOD OF PROVIDING AN OSCILLATOR OUTPUT SIGNAL

FIELD OF THE INVENTION

The present invention is directed to an oscillator circuit comprising an oscillator input for providing an input signal, a first integrator circuit comprising a first integrator capacitor and a first integrator output, a comparator, a discharge circuit for discharging said first integrator capacitor once per cycle of said oscillator circuit, and an oscillator output for providing an output signal.

The present invention is further directed to a method of providing an oscillator output signal.

BACKGROUND OF THE INVENTION

The frequency accuracy of RC oscillators is limited by the inaccuracy and temperature drift of the frequency setting components. Ideally these should be the resistor R and the capacitor C. However in practice non-ideal behavior of the active components in the oscillator contributes as well. This is especially significant in high speed oscillators and low power oscillators where delay and non-linearity are major contributors to inaccuracy and frequency drift.

The period time (and frequency) of RC based relaxation oscillators is defined by the value of the RC product only. In practice this is not the case for example due to circuit delay and circuit non-linearity. In high accuracy oscillators the contribution of other circuit elements (than the resistor R and capacitor C) is minimized by special circuit topologies.

FIG. 1 shows the principle of a high accuracy RC oscillator of the prior art. The oscillator is built around an integrator and a comparator. For practical reasons, amongst others for making the oscillator circuit less sensitive to small voltage fluctuations caused by noise at the comparators input, the comparator has voltage hysteresis. The reference current source $I_{ref}$ is derived from the reference voltage $V_{ref}$ and a resistor R ($I_{ref}=V_{ref}/R$). The circuit to create the current is not shown. The output frequency is: $F_{out}=1/RC_{sw}$. In FIG. 2 the relevant waveforms are shown. This type of oscillator can be implemented in different ways.

The oscillator frequency produced by the circuit of FIG. 1 is insensitive to comparator delay and other comparator non-idealities. It is therefore very accurate and reliable as compared to other oscillator designs, allowing for a broad field of application in particular in applications requiring high speed and/or low power oscillators.

However, despite the abovementioned accuracy, non-idealities of the comparator are not the only cause of inaccuracy of the frequency. As the market demand for high speed oscillators and low power applications grows, the requirements with respect to accuracy become more and more strict.

A disadvantage of the prior art oscillator design depicted in FIG. 1, is that the frequency accuracy not only depends on the comparator, but also on the rest of the circuit, in particular the integrator. In the oscillator circuit of FIG. 1, the integrator is continuously integrating the current supplied by the current source and once per period the charge at capacitor C is transferred to the integrator capacitor.

The saw-tooth shaped waveform at $V_{out}$ (see FIG. 2a) shows the slow linear down ramp due to current integration. The rising edge due to charge transfer has zero rise time when the opamp is ideal. However in practice the rise time is limited by the bandwidth and slew rate of the opamp and the rising edge is strongly distorted. During charge transfer the limited bandwidth and slew rate of the opamp cause the integrator to be pushed out of its linear operation mode and the virtual ground voltage at the negative input of the opamp will vary. Therefore the current from the current source (which is not ideal and has a limited output resistance) will vary too and so does the period time and frequency (FIG. 2d shows the real waveforms and the longer period time).

To reduce this effect the charge transfer must be fast which requires a high speed opamp. However such opamp has a high current consumption and makes the circuit not suitable anymore for low current consumption applications.

SUMMARY OF THE INVENTION

The present invention has for its object to provide an oscillation circuit and method that obviates the abovementioned problems of the prior art, providing an oscillator signal that is reliable and accurate with respect to the provided frequency, and which is suitable to be applied in high speed and low power applications.

To this end, the present invention provides, according to a first aspect thereof, an oscillator circuit comprising an oscillator input for providing an input signal, a first integrator circuit comprising a first integrator capacitor and a first integrator output, a comparator, a discharge circuit for discharging said first integrator capacitor once per cycle of said oscillator circuit, and an oscillator output for providing an output signal, wherein said oscillator circuit further comprises a second integrator circuit comprising a second integrator capacitor and a second integrator output, and wherein said oscillator circuit is arranged for allowing said input signal to be subsequently integrated by said first and second integrator circuit in an alternating manner, and for providing said integrated output signal of said first and second integrator circuit subsequently to said comparator in said alternating manner.

The present invention is based on the insight that the non idealities of the oscillator circuit of the prior art can be easily overcome by providing a second integrator circuit, and excluding the non ideal parts of the output signal of the integrators. In particular, the first and second integrator circuits of the oscillator circuit of the invention operate in anti-phase, in the sense that the first integrator circuit receives the input signal and integrates this while providing it to the comparator, while at that same time the second integrator circuit resets when it is not connected to the comparator circuit (in this connection, the term 'reset' is intended to indicate that the capacitor of the integrator is discharged). As soon as the comparator switches the outputs signal, this causes the system to switch the input signal to the second integrator which starts integrating it and provides it at the same time to the comparator circuit. By excluding the non ideal part of the output signal of each of the integrators subsequently in an alternating manner, it becomes possible to provide at the output of the oscillator circuit an ideal oscillating signal. Such a signal may be applied in many different applications, for example as a clock signal in a low power digital application. Since the frequency of the system is very accurate and the system is almost insensitive to environmental parameters, the oscillator of the present invention can be used in low power high speed digital systems.

According to a further embodiment of the present invention, the oscillator circuit of the invention comprises a switching unit arranged for allowing said input signal to be subsequently integrated by said first and second integrator circuit in an alternating manner, and for providing said integrated output signal of said first and second integrator circuit subsequently to said comparator in said alternating manner. As the skilled person may appreciate, various solutions are possible for enabling this.

According to a particular solution, the switching unit comprises an integrator switch for switching a comparator input of said comparator between said first integrator output and said second integrator output, for providing said integrated output signal of said first and second integrator circuit subsequently to said comparator in said alternating manner.

According to a further embodiment and solution as mentioned above, the switching unit comprises an input signal switch for switching said input signal between said first and second integrator circuit, and wherein said switching unit further comprises an integrator switch for switching a comparator input of said comparator between said first integrator output and said second integrator output, wherein said input signal switch and said integrator switch are arranged for allowing said input signal to be subsequently integrated by said first and second integrator circuit in an alternating manner, and for providing said integrated output signal of said first and second integrator circuit subsequently to said comparator in said alternating manner. As the skilled person may appreciate, this embodiment provides the advantage that at any time, at least one of the integrator circuits (i.e. the integrator circuit providing the clear integration of the input signal) provides the integrated input signal to the comparator, while the other integrator circuit is excluded from the system by disconnecting it from both the input and the comparator. This 'of line' stage during each cycle may for example be used for resetting the other integrator circuit, e.g. by discharging the integrator capacitor. In this respect, in a specific variant of this embodiment, the input signal switch and the integrator switch are arranged for performing the switching simultaneously.

For performing the switching in the above mentioned embodiment correctly and accurately, according to a further embodiment the switching unit further comprises a switch controller for controlling operation of the switching unit. In particular where the embodiment of the present invention comprises a switch (such as an input signal switch, an integrator switch and e.g. a discharge switch (as described below)), the use of a switch controller for cooperatively controlling operation of these switches in the switching unit provides an advantage for the oscillator circuit of the invention, since (amongst other) it provides for design flexibility by making the behaviour of the oscillator circuit programmable (e.g. controllable by setting the behaviour of the switch controller).

According to a further embodiment of the present invention, the oscillator circuit further comprises at least one discharge switch for providing a switchable connection between said discharge circuit and said first or said second integrator capacitor for discharging said first or said second integrator capacitor once per cycle of said oscillator circuit. The idea of using a discharge switch is that the discharge switch can be controlled/operated once per cycle for each of the integrator circuits, such as to discharge the integrator capacitor of each of the integrator circuits in turn in an alternating manner. In particular, while the integrated signal of one of the integrator circuits is provided to the comparator, the other of the integrator circuits may be discharged via the discharge circuit. The discharge switch may be part of the switching unit as mentioned above, in embodiments of the invention comprising a switching unit.

Further to this, i.e. in an embodiment comprising a switch controller and comprising a discharge switch which is part of the switching unit, the switch controller is arranged for controlling the switches of the switching units such that when, in operation of said oscillator circuit, said input signal switch switches said input signal to said first integrator circuit, said discharge switch connects said second integrator capacitor with said discharge circuit and said integrator switch conductively connects said first integrator output with said input of said comparator, and when said input signal switch switches said input signal to said second integrator circuit, said discharge switch connects said first integrator capacitor with said discharge circuit and said integrator switch conductively connects said second integrator output with said input of said comparator.

The oscillator circuit of the present invention may be arranged for receiving an external supply signal, for example from a power supply, for providing the output signal having a constant oscillator frequency at the oscillator output. In particular, the oscillator input may comprise a current source (providing a constant and invariable current) for providing the output signal having a constant oscillator frequency at the oscillator output.

According to another embodiment of the present invention, the input signal switch may comprise a make-before-break-type switch for allowing said input signal to be fed to at least one of said first and second integrator circuits at any time during operation of said oscillator circuit. In this respect, it is noted that the advantage of using a make-before-break-type switch, such as a gradual turn over (GTO) switch in a particular embodiment, is that at any time at least one of the integrator circuits receives the input signal providing an integrated output signal at its output. This prevents unwanted switching effects upon switching of the input signal switch during each cycle of the oscillator circuit.

According to a second aspect of the present invention, there is provided a method of providing an oscillator output signal, said method comprising the steps of integrating an input signal using an integrator unit for providing an integrated signal; providing said integrated signal to a comparator for providing a comparator output signal; and using said comparator output signal for providing said oscillator output signal, and for periodically discharging said integrator unit for resetting said integrated signal; wherein said step of integrating said input signal is performed using a first integrator circuit and a second integrator circuit of said integrator unit; wherein said step of providing said integrated signal to said comparator is performed by subsequently providing an output signal said first and second integrated signal to said comparator in an alternating manner.

According to a specific embodiment of this second aspect of the invention, the discharging of the integrator unit is performed by subsequently discharging a first integrator capacitor of said first integrator circuit while said output signal of said second integrator circuit is provided to said comparator and discharging a second integrator capacitor of said second integrator circuit while said output signal of said first integrator circuit is provided to said comparator, in an alternating manner.

BRIEF DESCRIPTION OF THE DRAWINGS

Hereinbelow, the present invention will be explained with reference to some specific examples thereof. The skilled person may appreciate that the principles of the invention can be practised otherwise than as specifically described with respect to the examples given. The examples will be explained with reference to the enclosed drawings, wherein:

FIG. 2a-d illustrate the output signal and integrated signals (and the switch status) of an idealised version of the circuit of FIG. 1, and the real integrated signal (FIG. 2d) of an actual version of the circuit of FIG. 1;

FIG. 4 illustrates a further embodiment of the present invention;

FIGS. 5a-5e illustrate the various output signals of the integrator and the comparator, including the switching status of FIGS. 2 and 4;

DETAILED DESCRIPTION OF THE EMBODIMENTS

Figure 1:
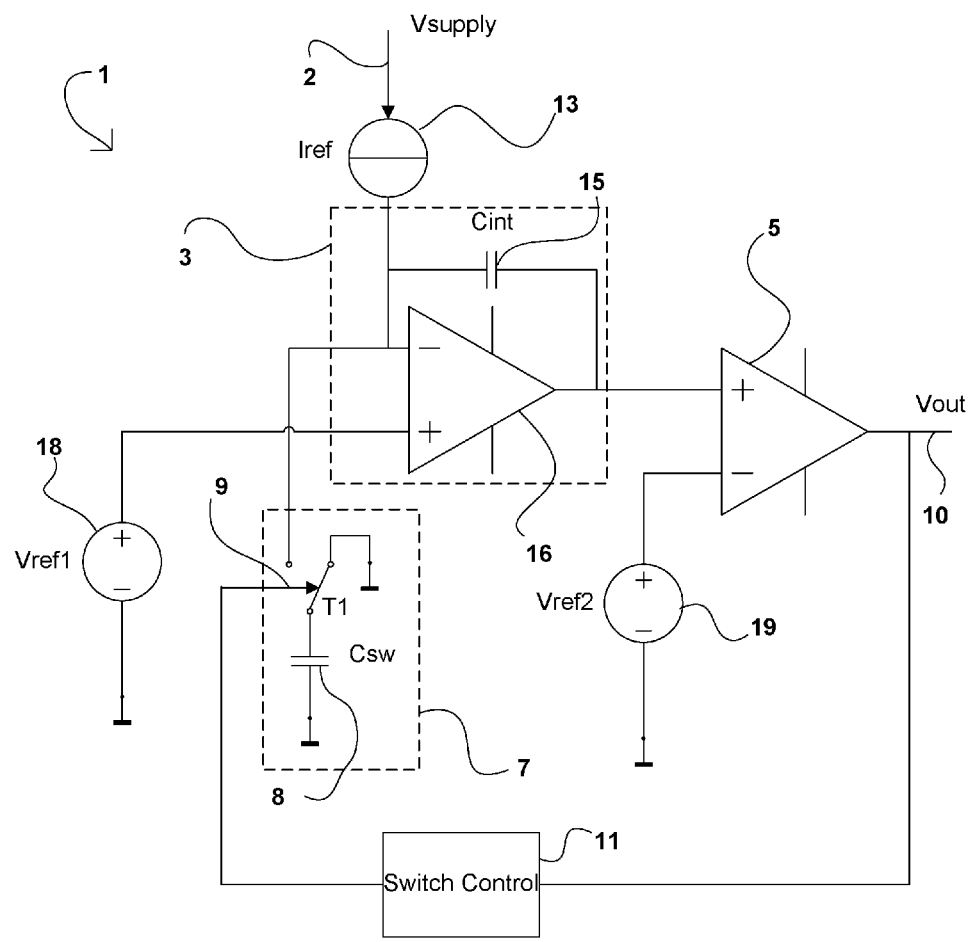
FIG. 1 discloses an oscillator circuit according to the prior art (described herein above)

FIG. 1 discloses an oscillator circuit according to the prior art. In FIG. 1 an input signal 2 is received and provided to a current source 13 which provides reference current $I_{ref}$ to integrator circuit 3. Integrator circuit 3 consists of capacitor $C_{int}$ 15 and an operational amplifier (opamp) 16. Operational amplifier 16 receives a reference voltage $V_{ref1}$ 18 at one of its inputs, and the reference current $I_{ref}$ from current source 13 at the other input. The output of integrator circuit 3 is provided to comparator 5 which compares this signal to a further reference voltage $V_{ref2}$ 19. The output of comparator 5 is also the output 10 of the oscillator circuit ($V_{out}$). This output signal $V_{out}$ is fed back to a switch controller 11 which controls the switching of T1 switch 9. When switch 9 is operated, the integrator capacitor $C_{int}$ 15 is discharged via the capacitor $C_{sw}$ 8 of the discharge circuit 7. Effectively, the integrator circuit 3 is reset by operating the discharge circuit 7. This is performed once per cycle of the output signal, allowing the oscillator circuit to oscillate.

An idealised representation of the integrated signal (the output signal of integrator circuit 3 which is provided to the input of comparator 5) is illustrated as $V_{int}$ in FIG. 2a. Each cycle, the integrator circuit starts integrating the incoming reference current $I_{ref}$, as represented by the decreasing slope of the signal $V_{int}$. After a while, and dependent on the reference voltage $V_{ref2}$ and the hysteresis of the comparator 5, the comparator 5 switches its output signal (as indicated by $V_{out}$ in FIG. 2b). This sets off switching of the discharge switch T1 9 by the switch controller 11. The switch controller 11 keeps the discharge switch 9 open for a sufficiently long time in order to allow discharging of the integrator capacitor $C_{int}$ 15.

In reality, discharging of the integrator capacitor $C_{int}$ 15 does not take place in a linear fashion as is suggested by FIG. 2a, but instead the output of the integrator circuit $V_{int}$ during discharging of the integrator capacitor 15 takes the form indicated in FIG. 2d. In fact, resetting of the integrator circuit 3 of the oscillator 1 of FIG. 1 takes longer than is expected based on the ideal case. Therefore, the periodicity of the output signal $V_{out}$ has a longer period time $T_{per}$ and as such a smaller frequency. This would not be much of a problem if the system would behave exactly the same under all circumstances, however in a non-ideal integrator circuit of the prior art, the behaviour during discharging of the integrator circuit is dependent on numerous environmental parameters (e.g. temperature and other factors) causing variations in the frequency of the output signal $V_{out}$.

Figures 3, 6:
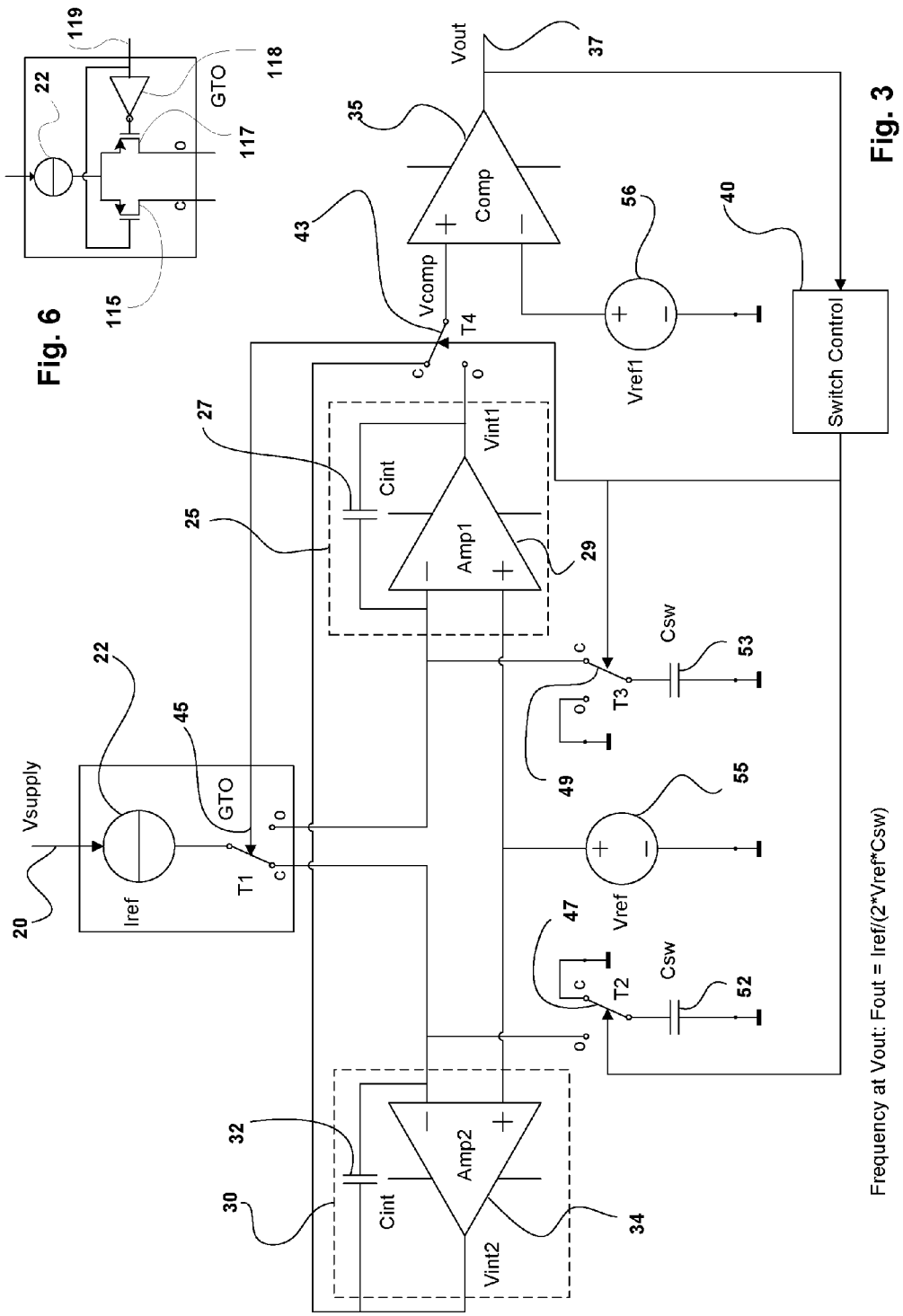
FIG. 3 illustrates an embodiment of the present invention.
FIG. 6 discloses a gradual turn over switch that may be used in an embodiment of the present invention.

In FIG. 3 an embodiment of an oscillation circuit according to the present invention is disclosed. The oscillation circuit comprises an input 20 for receiving an input signal, such as a power supply signal $V_{supply}$.

This signal is provided to a current source 22 providing a reference current $I_{ref}$ at its output.

The oscillator circuit of FIG. 3 further comprises a first integrator circuit 25 and second integrator circuit 30. The first integrator circuit 25 consist of first operational amplifier 29 (Amp1) and a first integrator capacitor 27 ($C_{int}$). At its output, the first integrator circuit provides a first integrated output signal $V_{int1}$.

The second integrator circuit 30 consists of a second operational amplifier 34 (Amp2), and a second integrator capacitor 32 ($C_{int}$). At its output, the second integrator circuit 30 provides a second integrated output signal $V_{int2}$.

The oscillator circuit of FIG. 3 further comprises a comparator 35 receiving a comparator input signal $V_{com}$ based on the output signals of the first integrator circuit 25 and the second integrator circuit 30 as will be explained later. The comparator input signal $V_{com}$ is compared to a reference voltage $V_{ref}$ 56. At the output of the comparator there is provided the output signal $V_{out}$ 37 of the oscillator circuit.

This output signal $V_{out}$ is further fed back to the switch controller 40 which controls switches 43 (T4), 45 (T1), 47 (T2) and 49 (T3). Although the switch controller may switch the various switches 43, 45, 47 ad 49 (T1-T4) in any suitable way for providing the benefits of the present invention, in a preferred embodiment the switch controller controls switching of the various switches simultaneously as will be explained below.

At the same time as switching input signal switch 45, the switch controller switches integrator switch 43 such that at the input at comparator 35 ($V_{com}$) the comparator 35 always receives the clean integrated input signal from at least one of the first integrator circuit 25, or the second integrator circuit 30. With preference, input signal switch T1 (45) is a make-before-break-type switch, such as a gradual turn over (GTO) switch. An example of such a gradual turn over (GTO) switch is illustrated in FIG. 6, and will be explained later.

With preference, switching discharge switches 47 and 49 from the closed to the open position is also performed simultaneously with respect to each other, and with further preference, simultaneously with switching the integrator switch 43 and the input signal switch 45. Therefore, in the most preferred embodiment, all these switches T1-T4 are operated simultaneously during each cycle of the output signal. The skilled person however will appreciate that it is not intended to discharge any of the integrators while it's output is connected to the comparator; therefore, the term 'simultaneously' should be interpreted such that the switches 43, 45, 47, and 49 (i.e. T1, T2, T3, and T4) are operated at the same time, but such that any of the integrator circuits 25 or 30 is only discharged once it is disconnected from the input by means of T1 and disconnected from the comparator by T4.

As follows from the oscillator circuit layout, at any time when one of the integrator circuits (25 or 30) is connected with its output to the comparator, the other of the integrator circuits is connected to the discharge circuit, discharging the integrator capacitor 27 or 32 through either switch capacitor 53 or 52 respectively. Therefore, while the first integrator circuit 25 provides its integrated output signal $V_{int1}$ to the input of the comparator 35 $V_{comp}$, the second integrator circuit 30 discharges via switch capacitor 52. At the same time, when the second integrator circuit 30 is connected with its output $V_{int2}$ to the input of the comparator 35 $V_{comp}$, the first integrator circuit 25 discharges through switch capacitor 53. As a result, the non ideal discharging phase of each of the integrators is excluded from being provided to the comparator input. As a result, the output signal $V_{out}$ of the oscillator circuit is very stabile at high frequencies, providing a very accurate frequency.

The principle of operation of the oscillator circuit of the present invention is illustrated in FIGS. 5a-5e. FIG. 5a illustrates the output signal of the first integrator circuit 25, $V_{int1}$. In the example, the first integrator starts integrating the incoming input signal providing a linear decreasing slope as illustrated in FIG. 5a.

FIG. 5b illustrates the output signal $V_{int2}$ of the second integrator circuit 30. While the first integrator circuit 25 integrates the incoming input signal providing the linear decreasing slope, the second integrator circuit 30 is being discharged through capacitor $C_{sw}$ (please note that in FIG. 3 this requires all the switches T1, T2, T3 and T4 to be in the open (o) position, while as illustrated they are in the closed (c) position).

In FIG. 5e the comparator input signal $V_{comp}$ is illustrated. Receiving the integrated output signal $V_{int1}$ from the first integrator circuit, $V_{comp}$ starts with a linear decreasing slope. Upon reaching the reference voltage $v_{ref1}$ (and dependent on the hysteresis) the output $V_{out}$ of the comparator 35 switches from high to low, as indicated in FIG. 5c. This triggers the switch controllers 40 to operate the switches T1, T2, T3 and T4 as indicated in FIG. 5d. Now, the second integrator circuit 30 starts integrating the input signal which is received at its input, resulting in a linear decreasing slope as indicated in FIG. 5b (second part of the cycle of $V_{int2}$). The switching to the second integrator circuit 30 causes the comparator to immediately switch its output signal back to 'high', as indicated in FIG. 5c. The switch controller maintains the position of the switches until the next time that the output signal $V_{out}$ of the comparator 35 at the output 37 of the oscillator circuit switches to 'low' again. After that, the first integrator circuit 25 can start receiving and integrating the input signal from the current source 22 as indicated in the FIGS. 5a-5e.

An alternative embodiment of the oscillator circuit of the present invention is illustrated in FIG. 4. In FIG. 4, the main difference is in the way in which the integrator circuits are being discharged.

FIG. 4 discloses the input signal $V_{supply}$ 6, the current source 62, the first integrator circuit 65 and the second integrator circuit 70. The first integrator circuit 65 is comprised of a first amplifier (Amp1) 69 and a integrator capacitor $C_{int}$ 67. The second integrator circuit 70 is comprised of a integrator capacitor 72 and a second amplifier (Amp2), 74. Again, the integrator circuits 65 and 70 in an alternating manner receive the input signal from the current source 62 by means of switching of the gradual turnover switch T1, 85. The output signals $V_{int1}$ and $V_{int2}$ of the first integrator circuit 65 and second integrator circuit 70 is provided to the input of the comparator 75 via switch 83. The integrator switch 83 and input signal switch 85, and the discharge switches 87 and 89 (all together, T1, T2, T3, and T4) are being controlled by the switch controller 80. The switch controller 80 receives the output signal $V_{out}$ from the output 77 of the oscillator circuit. The principle of operation of the embodiment of FIG. 4 is identical to the principle of operation of the embodiment of FIG. 3, and the relevant signals are illustrated in FIG. 5a-5e (these diagrams apply to both embodiments). What differs between the embodiments of FIG. 3 and FIG. 4 is the output frequency. The output frequency $F_{out}$ of the embodiment of FIG. 3 is equal to:

$$F_{out}=I_{ref}/(2*V_{ref}*C_{sw}) \quad (eq\ 1)$$

The embodiment of FIG. 4, the output frequency $F_{out}$ equals the following equation:

$$F_{out}=I_{ref}/(4*V_{ref}C_{sw}) \quad (eq\ 2)$$

Also different in the embodiment of FIG. 4 is the manner in which the discharge circuit (comprising switch capacitor $C_{sw}$ 90, and ground potentials 98 and 99) is operated. In the embodiment of FIG. 4, upon triggering of the switch controller, and switching of the input signal switch T1 (85) and integrator switch T4 (83), the discharge switches 87 and 89 are simultaneously operated. As can be seen, either the first integrator circuit 65 or the second integrator circuit 70 is being discharged through the switch capacitors $C_{sw}$ while the other of the integrator circuits 65 and 70 provides the integrated signal to the input of the comparator 75. Not only this reduces the amount of components used for implementing the oscillator circuit of the present invention (enabling a smaller end product), but also the embodiment of FIG. 4 doubles the amount of charge that may be transferred per period through the switch capacitors $C_{sw}$, and halves the frequency for the same value of $C_{sw}$ and $V_{ref}$, as follows from the above equations eq1 and eq2.

Further to the above, in FIG. 6 there is disclosed a gradual turnover switch that may be used in an embodiment of the present invention. In the gradual turnover switch disclosed in FIG. 6, current source 22 provides its output via two transistors 115 and 117 to either one of the outputs c or o. the transistors 117 and 115 are controlled through switch operation input 119, and as can be seen, transistor 117 is connected to the switch operation input 119 through NOT-port 118, and as a result this transistor 117 is closed when transistor 117 is open and vice versa. A connection between the current source 22 and one of the integrator circuits 25 or 30 of the embodiment illustrated in FIG. 3 is always created before the other connection is disconnected.

The skilled person may appreciate that the present invention can be practised otherwise than a specifically described herein. However, the scope of the invention is not intended to be limited by the specific examples described herein above, but only by the scope of the appended claims.

What is claimed is:

1. Oscillator circuit comprising a current source for providing an reference current, a first integrator circuit comprising a first integrator capacitor and a first integrator output, a first discharge circuit for discharging said first integrator capacitor once per cycle of said oscillator circuit, and an oscillator output for providing an output signal, wherein said oscillator circuit further comprises a second integrator circuit comprising a second integrator capacitor and a second integrator output, a second discharge circuit for discharging said second integrator capacitor once per cycle of said oscillator circuit, a comparator for comparing said first integrator output and said second integrated output signals respectively to a reference voltage and thereby providing said output signal at said oscillator output, and wherein said oscillator circuit is arranged for allowing said reference current to be integrated by said first and second integrator circuit respectively in an alternating manner, and for providing a first integrated output signal of said first integrator circuit and a second integrated output signal of said second integrator circuit subsequently to said comparator in said alternating manner, such that when said reference current is integrated by said first integrator circuit said first integrated output signal is provided to said comparator and that when said reference current is integrated by said second integrator circuit said second integrator output signal is provided to said comparator respectively.

2. Oscillator circuit according to claim 1, said oscillator circuit comprising a switching unit arranged for allowing said reference current to be subsequently integrated by said first and second integrator circuit in an alternating manner, and for providing said integrated output signal of said first and second integrator circuit subsequently to said comparator in said alternating manner.

3. Oscillator circuit according to claim 2, wherein said switching unit comprises an reference current switch for switching said reference current between said first and second integrator circuit, and wherein said switching unit further comprises an integrator switch for switching a comparator input of said comparator between said first integrator output and said second integrator output, wherein said reference current switch and said integrator switch are arranged for allowing said reference current to be subsequently integrated by said first and second integrator circuit in an alternating manner, and for providing said integrated output signal of said first and second integrator circuit subsequently to said comparator in said alternating manner.

4. Oscillator circuit according to claim 3, wherein said reference current switch and said integrator switch are arranged for performing said switching simultaneously.

5. Oscillator circuit according to claim 3, further comprising at least one discharge switch for providing a switchable connection between said discharge circuit and said first or said second integrator capacitor for discharging said first or said second integrator capacitor once per cycle of said oscillator circuit.

6. Oscillator circuit according to claim 5, wherein said at least one discharge switch is comprised by said switching unit.

7. Oscillator circuit according to claims 5, wherein said switch controller is arranged for controlling said switches of said switching unit such that when, in operation of said oscillator circuit, said reference current switch switches said reference current to said first integrator circuit, said discharge switch connects said second integrator capacitor with said discharge circuit and said integrator switch conductively connects said first integrator output with said input of said comparator, and when said reference current switch switches said reference current to said second integrator circuit, said discharge switch connects said first integrator capacitor with said discharge circuit and said integrator switch conductively connects said second integrator output with said input of said comparator.

8. Oscillator circuit according to claim 3, wherein said reference current switch comprises a make-before-break-type switch for allowing said reference current to be fed to at least one of said first and second integrator circuits at any time during operation of said oscillator circuit.

9. Oscillator circuit according to claim 8, wherein said make-before-break-type switch is a gradual turn over (GTO) switch.

10. Method of providing an oscillator output signal, said method comprising:
    integrating a reference current using a first integrator circuit for providing a first integrated output signal; and
    subsequently discharging said first integrator;
    integrating the reference current using a second integrator circuit for providing a second integrated output signal; and
    subsequently discharging said second integrator;
    providing said reference current to said first and second integrator circuit in an alternating manner, and comparing said first integrated signal and second integrated signal to a reference voltage
    in said alternating manner, such that when said reference current is integrated by said first integrator circuit said first integrated output signal is provided to said comparator and that when said reference current is integrated by said second integrator circuit said second integrated output signal is provided to said comparator respectively;
    providing a comparator output signal based on the respective comparison of the first and second integrated output signals to the reference voltage respectively.

11. Method according to claim 10, wherein said discharging of said integrator circuit is performed by subsequently discharging a first integrator capacitor of said first integrator circuit while said output signal of said second integrator circuit is provided to said comparator and discharging a second integrator capacitor of said second integrator circuit while said output signal of said first integrator circuit is provided to said comparator, in said alternating manner.

* * * * *